United States Patent [19]

Baker, Jr., Deceased

[11] Patent Number: 5,732,462
[45] Date of Patent: Mar. 31, 1998

[54] FIXTURE FOR ASSEMBLING ELECTRONIC CIRCUIT MODULES

[75] Inventor: Arthur Richard Baker, Jr., Deceased, Burlington, Vt., by Roberta A. Baker, executrix

[73] Assignee: International Business Machines Corporation, Armonk, N.Y.

[21] Appl. No.: 451,375

[22] Filed: May 30, 1995

[51] Int. Cl.⁶ .................................................. B23P 19/04
[52] U.S. Cl. .............................. 29/760; 29/758; 29/759; 269/903
[58] Field of Search .................... 29/464, 467, 468, 29/757–760, 830, 903

[56] References Cited

U.S. PATENT DOCUMENTS

| | | | |
|---|---|---|---|
| 3,755,048 | 8/1973 | Schubert | 269/903 X |
| 4,506,442 | 3/1985 | Alzman et al. | 29/830 |
| 4,617,160 | 10/1986 | Belanger et al. | 29/830 X |
| 4,704,319 | 11/1987 | Belanger et al. | 428/209 |
| 4,767,984 | 8/1988 | Bakker | 29/760 X |
| 5,101,550 | 4/1992 | Dunaway et al. | 29/760 |
| 5,316,278 | 5/1994 | Sherstinsky et al. | 269/903 X |

FOREIGN PATENT DOCUMENTS

| | | | |
|---|---|---|---|
| 2431507 | 1/1976 | Germany | 269/903 |
| 834957 | 5/1981 | U.S.S.R. | 29/760 |

OTHER PUBLICATIONS

"Semi–Universal Chip Carrier Package Holding Fixture for Branding" Manfredi, RCA Technical Notes, TN No. 1345, Apr. 1984, Two Sheets.

Primary Examiner—Peter Vo
Attorney, Agent, or Firm—Thornton & Thornton

[57] ABSTRACT

A fixture having an open ended housing cavity defined by an inwardly inclined wall, and including at least one moveable segment having an inwardly facing wall which defines one wall of a stack cavity configured for receiving a plurality of circuits chips positioned one over another for bonding together in a stack configuration, and an outwardly facing wall of the segment is inclined at the angle of the inclined wall of the housing and arranged in mating relation therewith such that when the segment is moved in one direction along the inclined wall of the housing, it will be urged inwardly to align the circuit chips within the stack cavity, and when urged in an opposite direction it can move outwardly to expand the stack cavity for loading and unloading. A truncated cone shaped housing cavity is preferred with four movable segments having outwardly facing walls inclined similar to the inclined wall of the housing cavity and in mating relation therewith such that when the segments are moved upwardly along the inclined housing surface, they can be urged away from each other to expand the stack cavity, and when the segment are moved downwardly along the inclined surface of the housing, they will be urged inwardly to align the circuit chips in the stack cavity.

17 Claims, 2 Drawing Sheets

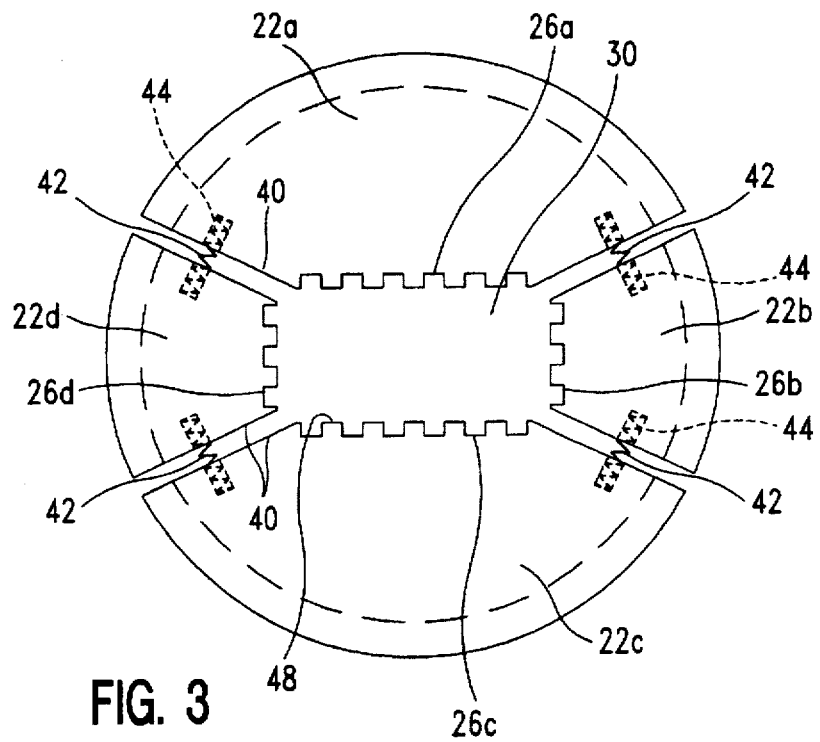
FIG. 3
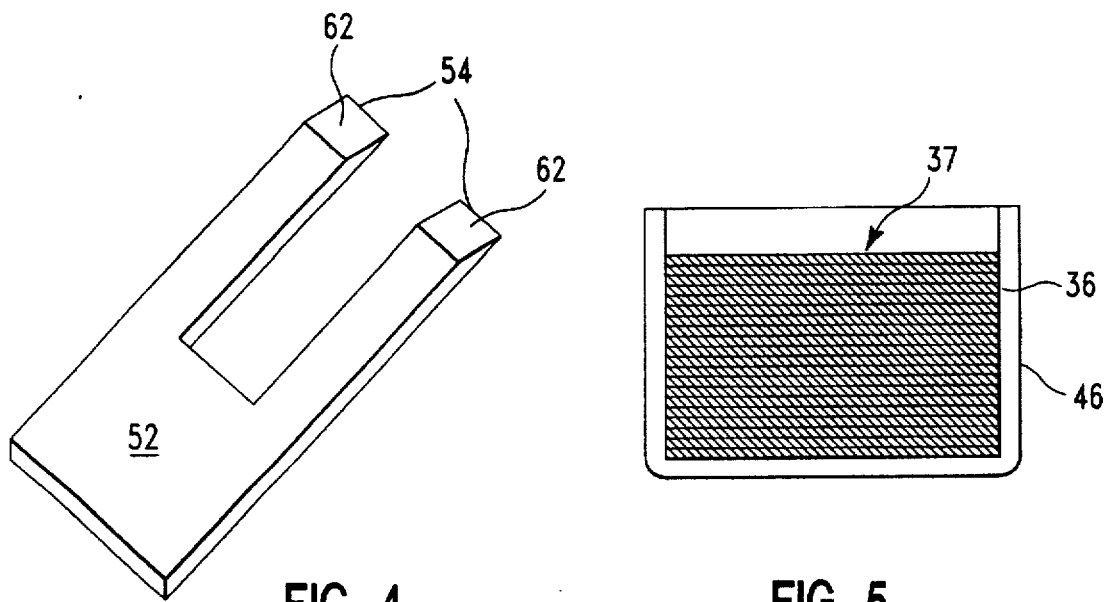
FIG. 4
FIG. 5

FIXTURE FOR ASSEMBLING ELECTRONIC CIRCUIT MODULES

FIELD OF THE INVENTION

This invention relates to assembly fixtures, and more particularly, to a fixture for laminating electronic circuit modules.

BACKGROUND OF THE INVENTION

In the construction of electronic modules, circuit chips are often assembled in a stack configuration within a cube build fixture with the planar chips positioned one over the other with interleaved deposits, or layers of bonding material. Such fixtures are designed to laterally align the chips, and support and confine them in a stack configuration to facilitate application of light pressure for bonding the layers into a laminated module. In some arrangements, the walls of the cavity are grooved to accommodate the flow of excess adhesive from the chip stack, and a thin foil, of aluminum for example, is interposed between the sides of the chip stack and the sidewalls of the cavity to preclude adhesion to the stack cavity.

Presently available fixtures for assembling circuit chip modules, provide a stack defining configuration, such as a stack cavity, with a removable section designed to facilitate loading of circuit chips in a stack within the fixture, as for example, is shown in U.S. Pat. No. 4,704,319. In this arrangement, a block is formed around a stack of chips to produce an open top cavity, having one or more removable side walls to allow stacking of the circuit chips. The open ended cavity is of a size to accommodate the lateral dimensions of the circuit chips to laterally align them for bonding. The chips are assembled one on the other within the cavity through its top and open wall section. Following stack assembly, the absent sidewalls are replaced, and a low level force applied to the top of the assembled stack, e.g., through a press arrangement, to hold the stacked chips under light pressure as the bonding material is allowed to set. This assembly fixture is constructed of material having a particular specific coefficient of expansion to accommodate the application of heat during bonding, and the sidewalls of the stack cavity are grooved to allow for excess adhesive.

In a slightly different arrangement, a stacking fixture is provided by upright pins, or rods mounted on a flat support surface to produce an outline of the lateral dimensions of the chips for aligning them in a stacked configuration. To facilitate stacking of the chips within the upright rods, one or more of them, may be made removable.

While the above noted fixtures facilitate bonding of the circuit chips in a stack or cube, it should be evident that they do not provide as rapid, or efficient loading of the chips, as is desirable. Moreover, it can also be seen that these fixtures generally require manual steps which do not easily lend themselves to automation of the electronic module assembly.

SUMMARY OF THE INVENTION

An object of the present invention is to provide an improved assembly fixture for laminating circuit chips into a modular configuration.

A further object of the invention is to provide a fixture designed for simple, convenient loading of circuits chips in a stack configuration for bonding as a laminated module.

A still further object of the invention is to provide an assembly fixture having an expandable stack cavity allowing convenient loading of the chips within, and removal of the completed module from, the stack cavity.

Another object of the invention is to provide a fixture having a stack cavity alterable between a stack aligning size for enabling bonding of circuit chips into a laminated module, and an expanded size designed for convenient loading of the chips in, and removal of the laminated module from, the stack cavity.

Still another object of the invention is to provide a electronic module building fixture particularly suited for automated assembly of circuits chips modules.

These desirable results, and other objects of the present invention, are realized and provided by a housing having an open ended housing cavity defined at least in part, by an inwardly facing, inclined wall which defines an inclined surface having one end spaced more closely to the center of the housing than the other. The housing cavity contains at least one moveable segment which defines an open ended stack cavity configured for receiving circuits chips positioned one over another for bonding into a stack configuration. An inwardly facing wall of the moveable segment forms at least a portion of one wall of the stack cavity, and an outwardly facing wall of the segment is inclined at an angle similar to that of the inclined housing surface and arranged in mating relation therewith such that, when the segment is moved along the inclined surface of the housing in a given direction, the segment will be automatically urged inwardly to laterally confine the circuit chips positioned in the stack cavity between its inwardly facing wall and the opposite wall of the stack cavity, and when the segment is moved in an opposite direction, the segment can move outwardly to expand the stack cavity, and thereby facilitate its loading and unloading.

For rectilinear chips, at least two adjacent segments are preferred, and a spring arrangement biases the segments away from each other to automatically alter the cavity to its expanded mode when its moved in a select direction along the inclined surface. In the preferred embodiment, the housing cavity is generally circular in lateral cross section with its inwardly facing wall inclined downwardly and inwardly from the upper surface of the housing to form a truncated, cone-shaped housing cavity. Four moveable segments are supported within the housing cavity by its inclined wall, with each segment having an inwardly facing, substantially upright wall for defining the sidewalls of a stack cavity. Each segment also includes an outwardly facing wall, inclined in a fashion similar to that of the inclined surface of the housing cavity and in mating relation therewith such that when the segments are moved upwardly along the inclined housing surface, they can be urged outwardly from each other to expand the stack cavity for loading and unloading, and as they are moved downwardly along the inclined surface, they will be urged inwardly to align the stacked circuit chips within the stack cavity.

BRIEF DESCRIPTION OF THE DRAWINGS

FIG. 3 is a plan view illustrating an expanded cavity configuration of the moveable segments of the fixture illustrated in FIGS. 1 and 2;

FIG. 4 is view in perspective of a lifting bar for raising the moveable segments so as to release the electronic module following its assembly; and FIG. 5 is a diagrammatic view in section of a stack of circuit chips assembled within a bag for loading in the fixture illustrated in FIGS. 1 to 3.

DESCRIPTION OF THE PREFERRED EMBODIMENT

Figure 1:
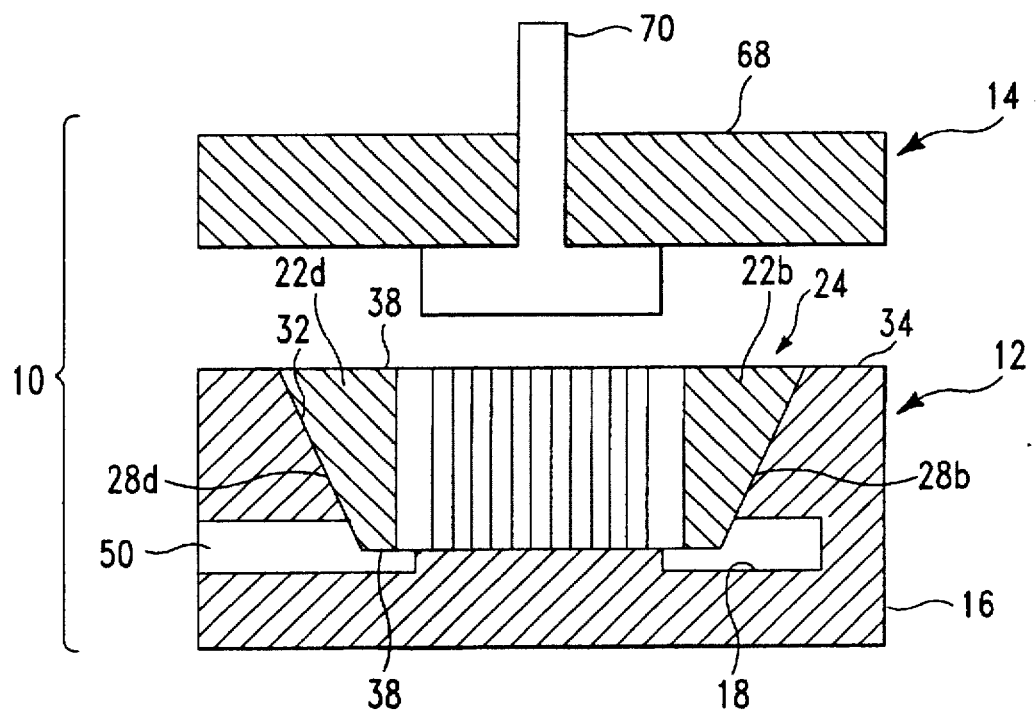
FIG. 1 is a view in section of a fixture providing moveable segments for assembling a laminated electronic module in accordance with the invention.
Figure 2:
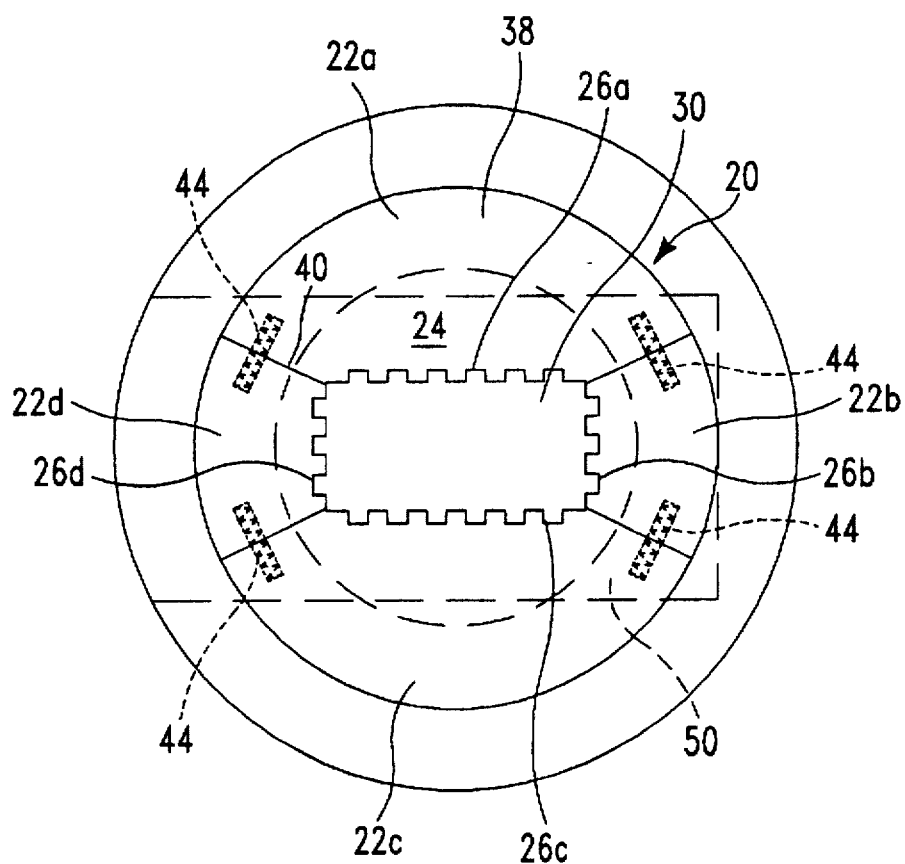
FIG. 2 is a plan view of the lower portion of the fixture shown in FIG. 1.

Basically, the present invention, as illustrated in FIGS. 1 and 2, provides a jig, or assemble fixture 10 comprising a stacking fixture 12 and a pressure plate assembly 14. The stacking fixture 12 consists of a housing 16 having an open ended housing cavity 20 extending downwardly to a bottom surface 18 of this cavity.

Four moveable segments 22a, 22b, 22c and 22d form an inner assembly 24 within the housing cavity 20, and inwardly facing, upright walls 26a, 26b, 26c, and 26d of each segment define the sidewalls of a centrally located, stack cavity 30. As will be subsequently explained in detail, the stack cavity 30 is designed to laterally position a plurality of circuit chips 36 in a stack 37 (both of which are shown in FIG. 5) for bonding to a laminated electronic circuit cube, or module (not shown).

As can be seen in FIG. 1, the housing cavity 20 is defined by an inwardly facing, inclined wall surface 32 which inclines inwardly, approximately at an angle of 30 degrees, from a top surface 34 of the housing 16 to the bottom surface 18. Consequently, the inclined surface 32, provides a truncated cone shape to the housing cavity 20.

The four segments 22a–d, which make up the inner assembly 24, are aligned within the housing cavity 20 in lateral engagement with each other as illustrated in FIGS. 1 and 2. This is accomplished by virtue of the fact that the segments 22a–d, each have an outwardly facing, inclined wall surfaces of which only surfaces 28b and 28d are shown in FIG. 1. These wall surfaces are inclined at approximately the same angle as the inclined surface 32, and mated thereto so that gravity tends to draws the four segments toward each other as illustrated in FIGS. 1 and 2. To enhance movement of the segments 22a–d along the inclined surface 32, as later explained, all the inclined surfaces are brought to a highly polished finish.

In the preferred embodiment, the four segments 22a–d are machined to provide a truncated cone shape for the inner assembly 24 such that, when the segments are mated together in the housing cavity 20, the outer diameter of the inner assembly 24 at its top surface 38, will be approximately equal to the diameter of the housing cavity 20 where it opens to the top surface 34.

To define a suitable stack cavity 30, the inner assembly 24, formed by the segments 22a–d when assembled in the housing cavity 20, is designed to equal the maximum dimensions of the chips to be assembled into a module. Stated otherwise, for stack construction with chips 36 of a given maximum length and width, the dimensions of the segments 22a–d are designed to define a stack cavity 30 equal to these maximum lateral dimensions plus twice the thickness of an aluminum separation sheet, since the latter is employed on all four sides, as later explained in more detail in regard to FIG. 5.

The segments 22a–d are shown slightly spaced apart in FIG. 3 to depict the expanded condition of the stack cavity 30, as later explained. For clarity, the spacing illustrated for the segments 22a–d is slightly exaggerated, to more adequately depict their structure. As shown in this FIG. 3, segments 22a–d are lightly biased apart at their lateral sides 40 by springs 42 to aid in the loading of the chips 36 and unloading of the assembled module (not shown), once curing has been completed. The springs 42 are carried within appropriate indents 44 in the lateral sidewalls 40 to urge the segments slightly apart when they are released from, or raised from, their confinement within the housing cavity 20.

Once the bonding is complete, the segments 22a–d are forced upward, allowing them to spring away from each other and expand the stack cavity 30. This reduces pressure on the side walls of the assembled module to facilitate its removal. That is, as the segments 22a–d are raised slightly in the stack cavity 30, they separate under the bias of the springs 42 to expand the cavity, as depicted in slightly exaggerated form in FIG. 3, for unloading of the assembled module, as well as acceptance of the next stack of chips for assembly.

As illustrated in FIG. 3, the springs 42 provide means for displacing, or biasing the segments 22a–d apart as the segments are raised from, and released from, confinement within the housing cavity. Other displacing means would also be applicable. For example, the outward edges of the lateral sides of the segments 22a–d could carry a cam surface (not shown), each of which is designed to engage one of four cams (not shown) of the housing cavity 20 so as to drive the segments apart as they are raised.

Advantageously, even slight upward movement of the segments releases them from confinement in the housing cavity and begins the expansion of the stack cavity. Consequently, where excess adhesive has exerted pressure against the sidewalls of the stack cavity 30, they will still easily break away from the module.

A slot 50 is provided within the housing 16 in a plane parallel to the surface 18, to facilitate lifting of the segments 22a–d. The height of the slot 50 is designed to intersect and pass beneath the bottom 48 of the segments when they are located in their module bonding position, shown in FIGS. 1 and 2. For lifting the segments 22a–d, a wedge shaped key or lifting bar 52, as shown in FIG. 4, is provided. The bar 52 is bifurcated to allow passage of its leading ends 54 around a centrally located section 60 (See FIG. 1) of the surface 18, which forms the bottom support for the chips in the stack cavity 30.

Each of the ends 54 of the lifting bar 52 include an inclined or ramped surface 62 which forms an inclined plane. Consequently, as the lifting bar 52 is inserted in the slot 50, its ramped surface will engage the bottom 38 of each of the moveable segments 22a–d to ramp them away from the bottom surface 18 so as to lift them, and thereby open the stack cavity 30.

The ramped surfaces 62 of the lifting bar 52 provides the mechanical advantage of a sliding plane to force the segments upwardly. This combined with rapid cavity expansion provides for efficient release of the module.

Other arrangements for lifting the segments 22a–d to allow opening of the stack cavity 30 can also be utilized. For example, of the housing 16 can have four small openings (not shown), one beneath each of the segments 22a–d to receive upright members or rods (not shown) inserted through the base and into engagement with the segments to raise the latter.

In the method of the preferred embodiment, the chips are not individually placed in the stack cavity 30, but into a shell or other holder such as the bag 46, shown in FIG. 5, for placement in the stack cavity 30 when the latter is in its expanded configuration. Hence, the chips 36 (with interposed adhesive (not shown), such as epoxy, are first stacked within the bag 46, and the filled bag 46 then deposited within the expanded stack cavity 30. The bag 46 is formed of aluminum or other releasable material, or otherwise coated with a suitable release coat.

As is evident, the bag 46 provides an easily loaded carrier for initial stacking of the chips for top loading in the expanded cavity and also precludes bonding of the stack to the stack cavity. To further enhance the latter, the inner walls 26a–d, which make up the stack cavity 30, are fluted or ribbed in a vertical direction, to minimize the surface area in contact with the bag, and to provide room for excess bonding material extruded from the stack.

In the method of assembly, with the bar 52 in place in the slot 50 and the cavity 30 is in its expanded condition, the fixture 10 is ready for loading. The filled bag 46 in placed in the expanded cavity and the lifting bar removed. At this point in the assembly, the force of gravity will draw the segments downward to loosely engage the chip filled aluminum bag 46, and indirectly through it, to the lateral edges of the stacked chips to align and confine them in a proper stack configuration with a high degree of precision.

Once the chip filled bag 46 has been placed within the stack cavity, the pressure plate assembly 14 (illustrated in FIG. 1) is placed on the housing 16 and aligned thereon by any suitable arrangement, such as aligning pins (not shown). As shown, the plate assembly 14 comprises a plate 68, and a piston 70. The plate 68 is designed to bear upon the segments 22a–d and force them flush with the housing top surface 34, at which point, their lateral sides 32 will be in engagement with each other to form a stack cavity 30 having lateral dimensions equal to the maximum dimensions of the chip filled bag 46, and as previously indicated, thereby laterally maintaining the chips in the stack 37 within an acceptable tolerance for module assembly.

Any suitable press arrangement (not shown) can be utilized to urge the segments downwardly and to independently apply a light downward force to the stack so as to permit the bonding material to set. In the illustrated embodiment, vertical pressure will be exerted on the stack of assembled chips by means of the piston 70, loosely carried within the plate 68. The plate 68 and the piston 70 are then forced against the fixture 12 by any press arrangement (not shown), which will hold the plate against the segments 22a–d and the top surface 34 and independently apply a light downward force to the piston 70 thereby providing appropriate pressure for curing of the module. The plate 68 may, of course, be clamped or fixed to the housing 16 by any suitable clamping mechanism (not shown) and its piston 70 separately urged downward.

As noted previously, the segments 22a–d are preferably designed to be substantially flush with the top surface 34 of the housing 16 when the segments are in their stack aligning mode. However, other arrangements will also be useful. For example, since the abutting of the lateral walls of the segments 22a–d is controlling, the top 38 of the segments can be above or below the top surface 34, so long as an appropriate force is exerted upon the segments to hold them in their abutted condition.

As noted earlier, abutting of the lateral sides of the segments defines the minimum size of the stack cavity in the preferred embodiment, however, the latter function could also be served by other arrangements. For example the inwardly facing walls 26a–d of the segments could be designed to abut adjoining ones to determine the stack cavity, or stops could be provided at the base of the walls 26a–d. The latter could also serve to provide a support base for the chip stack. Further, the size of the stack cavity could also be controlled by the bottoming of the segments 22a–d in the housing cavity.

Consequently, as can be seen from the above description of the preferred embodiment, the fixture 10 can provide alignment in the X and Y directions of a chip stack, as well as compression of the stack during curing. Assembly is convenient and straight forward, and the stacking fixture 12 is essentially self-aligning. Once the filled bag 46 is placed in the cavity 30, the bar 52 removed, and the segments urged downwardly into a flush condition with the top surface 34, no further adjustments of the stack cavity are required. All that remains is to apply a light pressure to the top of the stack until the bonding material is set. When the material is set, the segments are raised such that the cavity expands and the completed module is then removed.

Various arrangements of the assembly fixture may be useful in practicing the invention. Where one or two moveable segments are employed, the stack housing can provide fixed sides of the stack cavity. Moreover, moveable segments with curved inclined surfaces can be employed, as in the preferred embodiment, or with planar inclined surfaces (not shown). Both can permit alteration from a stack confining cavity to an expanded cavity.

A four segment fixture in which flat inclined surfaces are employed will also operate satisfactorily. Moreover, the inclination of the surfaces can be along an axis other than the downwardly disposed axis of the preferred embodiment. For example, the housing cavity 20 and the segments 22 a–d may be constructed with planar mating surfaces inclined with respect to the lateral axes of the stack cavity 30 such that the segments are moved along directions parallel to the top of the surface 34 of the fixture to alter the cavity condition.

Advantageously, the assembly fixture 10 will lend itself well to automation of the above described lamination of electronic circuit modules. That is, it should be appreciated that the chip bag 46 can be filled with chips 36, placed in the expanded stack cavity 30 and downward pressure applied, all by suitable machine operation. Likewise, the segments 22a–d can be raised and the module removed by machine, in readiness for repetition of the assembly process.

This completes the description of the preferred embodiment of the invention. Since changes may be made in the above process, without departing from the scope of the inventions described herein, it is intended that all the matter contained in the above description or shown in the accompanying drawings shall be interpreted in an illustrated and not in a limiting sense. Thus other alternatives and modifications will now become apparent to those skilled in the art without departing from the spirit and scope of the invention as set forth in the following claims.

What is claimed is:

1. A fixture for retaining circuit chips for bonding in an electronic module configuration, said fixture comprising:

a) a housing having an open ended cavity therein defined at least in part by an inclined housing wall; and b) at least one moveable segment positioned within said housing cavity, said segment having an inwardly facing wall defining a sidewall of an open ended stack cavity configured for receiving a plurality of circuits chips positioned one over another for bonding in a stack configuration, said segment having an outwardly facing wall inclined substantially similar to that of said inclined housing wall and in mating relation therewith such that when said segment is moved along said inclined housing wall in a given direction, said segment is urged inwardly toward said stack cavity to align the circuit chips therein between its said inwardly facing wall and the opposite wall of said stack cavity, and when said segment is moved along said inclined housing wall in an opposite direction, it is urged outwardly to expand said stack cavity for chip loading and module unloading.

2. The fixture of claim 1 wherein said inclined housing wall extends downwardly and inwardly in said housing, and said one segment is moved downwardly to urge its said inwardly facing wall to align the chips in said stack cavity and upwardly to expand said stack cavity.

3. The fixture of claim 2 including a top assembly for independently bearing downwardly upon the top surface of said segment and the top of the stack of chips in said stack cavity.

4. The fixture of claim 1 including at least two of said moveable segments, each of which form a sidewall of said stack cavity.

5. The fixture of claim 4 including means for biasing said segments away from each other as they are moved in said opposite direction such that they are automatically spaced apart from each other to expand said stack cavity during said movement in said opposite direction.

6. The fixture of claim 4 including a spring arrangement for biasing the adjacent sidewalls of said segments away from each other such that when they are moved in said opposite direction, they are automatically spaced apart from each other to expand said stack cavity.

7. The fixture of claim 4 wherein said circuit chips are flat chips of a substantially rectilinear shape of given lateral dimensions, and said segments are configured to provide a stack cavity whose lateral cross section is of rectilinear shape and slightly in excess of said given lateral dimensions.

8. The fixture of claim 4 wherein said plurality of segments consists of four segments, each of which provide one sidewall of said rectilinear stack cavity.

9. The fixture of claim 4 wherein said open end of said housing cavity is defined at the top surface of said housing, its said inclined housing wall extends downwardly and inwardly of said housing cavity, and said segment is moved downwardly to urge its said inwardly facing wall to align the chips in said stack cavity, and upwardly to expand said stack cavity.

10. The fixture of claim 9 including a top assembly for independently bearing downwardly upon the top surface of said segments and the top of the stack of chips in said stack cavity.

11. The fixture of claim 9 wherein said housing includes means for facilitating upward movement of said segments to release them from engagement with the assembled stack of chips for facilitating removal of said stack from said fixture.

12. The fixture of claim 11 wherein said means for facilitating upward movement of said segments includes a lifting member, and said housing having at least one opening in a lower portion thereof for facilitating insertion of said lifting member for engagement with said segments to raise them.

13. The fixture of claim 12 wherein said lifting member is a ramped bar, and said one opening is in the side of said housing to permit insertion of said bar beneath said segments so to ramp them upwardly along said inclined surface portion and away from said assembled stack.

14. A fixture for retaining circuit chips for bonding in an electronic module configuration, said fixture comprising:

a) a housing having a housing cavity of generally cone shaped cross section opening to the upper surface of said housing, the outer surface of said housing cavity being defined by an inclined housing wall extending downwardly and inwardly from said upper surface so as to form a truncated, cone-shaped cavity in said housing;

b) a plurality of moveable segments positioned within said housing cavity to define a stack cavity opening at the top surfaces of said segments, each of said segments having an inwardly facing wall defining one sidewall of said stack cavity and an outwardly facing wall inclined similar to that of said inclined housing wall and in mating relation therewith such that said segments may be moved downwardly along said inclined housing wall to urge said inwardly facing walls of said segments toward each other so as to align the circuit chips stacked in said stack cavity, and may be moved upwardly along said inclined housing wall to allow said segments to move away from each other so as to expand said stack cavity for circuit chip loading and module unloading.

15. The fixture of claim 14 wherein the width of each of said segments is such that when the lateral walls of each are in engagement with each other in said housing cavity their inwardly facing walls define a stack cavity whose lateral dimensions are slightly in excess of the maximum lateral dimensions of the circuits chips anticipated for assembly into a electronic module configuration therein.

16. The fixture of claim 14 including means for biasing said segments away from each other as they are moved in said opposite direction such that they are automatically spaced apart from each other to expand said stack cavity during said movement.

17. The fixture of claim 16 including a spring arrangement for biasing the adjacent sidewalls of said segments away from each other so that when said segments are moved in said opposite direction, they automatically spring apart from each other thereby expanding said stack cavity.

* * * * *